US010856460B2

(12) United States Patent
Tsuri

(10) Patent No.: US 10,856,460 B2
(45) Date of Patent: Dec. 1, 2020

(54) SURFACE MOUNTER FOR MOUNTING A COMPONENT ON A SUBSTRATE

(71) Applicant: Yamaha Hatsudoki Kabushiki Kaisha, Iwata (JP)

(72) Inventor: Kenji Tsuri, Iwata (JP)

(73) Assignee: YAMAHA HATSUDOKI KABUSHIKI KAISHA, Shizuoka (JP)

(*) Notice: Subject to any disclaimer, the term of this patent is extended or adjusted under 35 U.S.C. 154(b) by 300 days.

(21) Appl. No.: 15/762,388

(22) PCT Filed: Oct. 1, 2015

(86) PCT No.: PCT/JP2015/077947
§ 371 (c)(1),
(2) Date: Mar. 22, 2018

(87) PCT Pub. No.: WO2017/056292
PCT Pub. Date: Apr. 6, 2017

(65) Prior Publication Data
US 2018/0279520 A1    Sep. 27, 2018

(51) Int. Cl.
*H05K 13/04*      (2006.01)
*B25J 15/06*      (2006.01)
*B65G 47/90*      (2006.01)
*H01L 21/683*     (2006.01)

(52) U.S. Cl.
CPC ...... *H05K 13/0408* (2013.01); *B25J 15/0625* (2013.01); *B65G 47/90* (2013.01);
(Continued)

(58) Field of Classification Search
CPC ..... H05K 13/04; H05K 13/041; H01R 43/205
See application file for complete search history.

(56) References Cited

U.S. PATENT DOCUMENTS 5,579,572 A * 12/1996 Kashiwagi .......... H05K 13/041
                                                        29/836
6,101,707 A *  8/2000 Kano ................. H05K 13/0409
                                                        29/740
(Continued)

FOREIGN PATENT DOCUMENTS

JP    H05-145291 A    6/1993
JP    H05-145300 A    6/1993
(Continued)

OTHER PUBLICATIONS

An Office Action mailed by the Japanese Patent Office dated Oct. 9, 2018, which corresponds to Japanese Patent Application No. 2017-542639 and is related to U.S. Appl. No. 15/762,388.
(Continued)

*Primary Examiner* — Minh N Trinh
(74) *Attorney, Agent, or Firm* — Studebaker & Brackett PC

(57) ABSTRACT

A surface mounter comprising a stage including a mounting portion at which a component is mounted on a substrate, a substrate transferring device to transfer the substrate to the mounting portion, a component feeding device to feed the component toward the mounting portion, a component mounting device including a mounting head and that mounts the component on the substrate, a pickup nozzle that picks up and holds the component and releases the component on the substrate, a shaft member that switches a pressure applied to the pickup nozzle between negative pressure and positive pressure, and a drive unit that includes a drive source, a movable portion that moves using power from the drive source, and a cam follower, wherein the drive unit moves the movable portion to perform first and second movement operations of the shaft member.

6 Claims, 9 Drawing Sheets

(52) U.S. Cl.
CPC ....... *H01L 21/6838* (2013.01); *H05K 13/041* (2018.08); *H05K 13/0409* (2018.08)

(56) References Cited

U.S. PATENT DOCUMENTS

| | | | | |
|---|---|---|---|---|
| 7,100,278 | B2* | 9/2006 | Hata | H05K 13/041 29/834 |
| 8,240,028 | B2* | 8/2012 | Kanai | H05K 13/0413 29/739 |
| 2015/0237773 | A1* | 8/2015 | Nishiyama | H05K 13/0404 29/743 |
| 2018/0263149 | A1* | 9/2018 | Tsuri | H05K 13/0408 |
| 2018/0279520 | A1* | 9/2018 | Tsuri | H05K 13/0408 |

FOREIGN PATENT DOCUMENTS

| | | |
|---|---|---|
| JP | H11-040989 A | 2/1999 |
| JP | 2006-515715 A | 6/2006 |
| JP | 2013-069798 A | 4/2013 |
| JP | 2013-179117 A | 9/2013 |

OTHER PUBLICATIONS

An Office Action mailed by the Japanese Patent Office dated Apr. 16, 2019, which corresponds to Japanese Patent Application No. 2017-542639 and is related to U.S. Appl. No. 15/762,388.
International Search Report issued in PCT/JP2015/077947; dated Jan. 12, 2016.

\* cited by examiner

SURFACE MOUNTER FOR MOUNTING A COMPONENT ON A SUBSTRATE

CROSS-REFERENCE TO RELATED APPLICATION

This application is a National Stage of International Patent Application No. PCT/JP/2015/077947, filed Oct. 1, 2015, the entire content of which is incorporated herein by reference.

BACKGROUND

Technical Field

The technology disclosed herein relates to a mounting head and a surface mounter.

Background Art

A mounting head has been widely used in a surface mounter configured to mount electronic components on a printed substrate. The mounting head includes a plurality of pickup nozzles configured to hold a component at the front end by means of a negative pressure and configured to release the component held at the front end by means of a positive pressure. In some mounting heads of this type, a mechanical valve structure may be provided near the pickup nozzle such that the pressure applied to the pickup nozzle is switched between the negative pressure and the positive pressure. Japanese Unexamined Patent Application Publication No. 2013-69798, for example, discloses a placement head, which is a mounting head including such a mechanical valve structure.

The placement head disclosed in Japanese Unexamined Patent Application Publication No. 2013-69798 includes cylindrical valve spools, which are switching members configured to selectively switch the pressure applied to the pickup nozzles between the negative pressure and the positive pressure, and a switching member drive unit, which is configured to move the valve spool up and down in the axial direction of the valve spool. An engagement protruding portion having a plate-like shape extending in the direction perpendicular to the axial direction of the valve spools is disposed on the upper end of each of the valve spools. The switching member drive unit includes two rollers. The switching member drive unit is positioned such that the rollers are positioned on the upper and lower sides of the engagement protruding portion of the valve spool.

When the switching member drive unit is activated, the roller on the lower side comes in contact with the lower surface of the engagement protruding portion of the valve spool and moves up the valve spool, or the roller on the upper side comes in contact with the upper surface of the engagement protruding portion of the valve spool and moves down the valve spool. The valve spool is moved up and down in this way. A negative pressure is applied to the pickup nozzle when the valve spool is positioned at the upward end, and a positive pressure is applied to the pickup nozzle when the valve spool is positioned at the downward end.

SUMMARY

A cam follower may be used in a mounting head as a roller for moving the valve spool in the up-down direction as described above. However, the cam follower is expensive. If the placement head disclosed in Japanese Unexamined Patent Application Publication No. 2013-69798, which has two rollers in the switching member drive unit configured to move the valve spool in the up-down direction, employs cam followers as the rollers, the production cost of the placement head increases.

The technology disclosed herein is made in the view of the above-described problem and an object of the disclosure is to reduce the production cost.

The technology disclosed herein relates to a mounting head including a pickup nozzle configured to hold a component by suction at a front end thereof by means of a negative pressure and configured to release the component held at the front end by means of a positive pressure, a shaft member having a cylindrical shape and configured to move in an axial direction thereof to switch a pressure applied to the pickup nozzle between the negative pressure and the positive pressure, and a drive unit including a drive source, a movable portion configured to move in the axial direction by using power from the drive source, and a cam follower on the movable portion. The shaft member has two opposing portions extending in a direction intersecting the axial direction and facing each other with a space therebetween in the axial direction. The cam follower is positioned between the two opposing portions. The drive unit is configured to move the movable portion in the axial direction to perform a first movement operation in which the cam follower is brought into contact with one of the opposing portions to move the shaft member to one side in the axial direction and a second movement operation in which the cam follower is brought into contact with the other of the opposing portions to move the shaft member to the other side in the axial direction.

In the above-described mounting head, the cam follower of the drive unit is positioned between the opposing portions of the shaft member. The cam follower comes in contact with one of the opposing portions to move the opposing portion to one side in the axial direction of the shaft member. Thus, the first movement operation is performed. The cam follower comes in contact with the other of the opposing portions to move the opposing portion to the other side of the axial direction. Thus, the second movement operation is performed. In the drive unit, one cam follower is used to perform the first movement operation and the second movement operation.

The axial movement of the shaft member in the first movement operation and the second movement operation switches the pressure applied to the pickup nozzle between the negative pressure and the positive pressure. In the above-described mounting head, the number of cam followers provided on the movable portion is minimized to one, and the switching between the negative pressure and the positive pressure is performed by the one cam follower. This requires a lower production cost than the conventional mounting head that uses a plurality of cam followers for the switching between the negative pressure and the positive pressure.

The above-described mounting head may further include a housing member configured to house at least a portion of the shaft member except the two opposing portions in a movable manner in the axial direction. The shaft member may include a connection portion connecting the two opposing portions at a position away from a central axis of the shaft member. The cam follower on the movable portion that is positioned between the two opposing portions may be located on the central axis of the shaft member.

A sealing member such as an O-ring is generally disposed inside the housing member to seal (tightly seal) the gap between the inner surface of the housing member and the shaft member. If the distance between the portion of the cam follower that is in contact with the opposing portion and the central axis of the shaft member is large, during the first movement operation and the second movement operation, a moment is generated about a border between the portion housed in the housing member and the portion not housed in the housing member with the portion of the opposing portion that is in contact with the cam follower as a point of application, in addition to a traveling force in the axial direction of the shaft member. This forces the shaft member to tilt, and thus a portion of the sealing member inside the housing is locally pressed between the tilted shaft member and the housing member. This causes the portion of the sealing member to be unevenly abraded and worn sooner by the shaft member moved in and out the housing member. Thus, a service life of the sealing member is reduced.

Compared with this, in the above-described configuration, since the cam follower between the opposing portions is disposed on the central axis, the distance between the portion of the cam follower that is in contact with the opposing portion and the central axis of the shaft member is small. Thus, the portion of the sealing member in the housing member is less likely to be unevenly abraded.

In the above-described mounting head, ends of the opposing portions of the shaft member are located inwardly from an outline of the housing member toward a center in a planar direction perpendicular to the axial direction.

In a rotary type mounting head, if ends of the opposing portions are positioned outwardly from the housing member toward the outer side, rotational moment of inertia increases. In the above-described configuration, the ends of the opposing portions of the shaft member are located inwardly from the outline of the housing member toward the center, and the ends do not protrude to the outer side. Thus, rotational moment of inertia is less likely to increase, allowing a rotational portion to rotate at a higher speed.

Another technology disclosed herein relates to a surface mounter including the above-described mounting head, a component mounting device configured to mount a component on a substrate, a component feeding device configured to feed the component to the component mounting device, and a substrate transferring device configured to transfer the substrate to a mounting region where the component is mounted by the component mounting device.

The technology disclosed herein reduces the production cost.

DETAILED DESCRIPTION (Overall Configuration of Surface Mounter)

Figure 1:
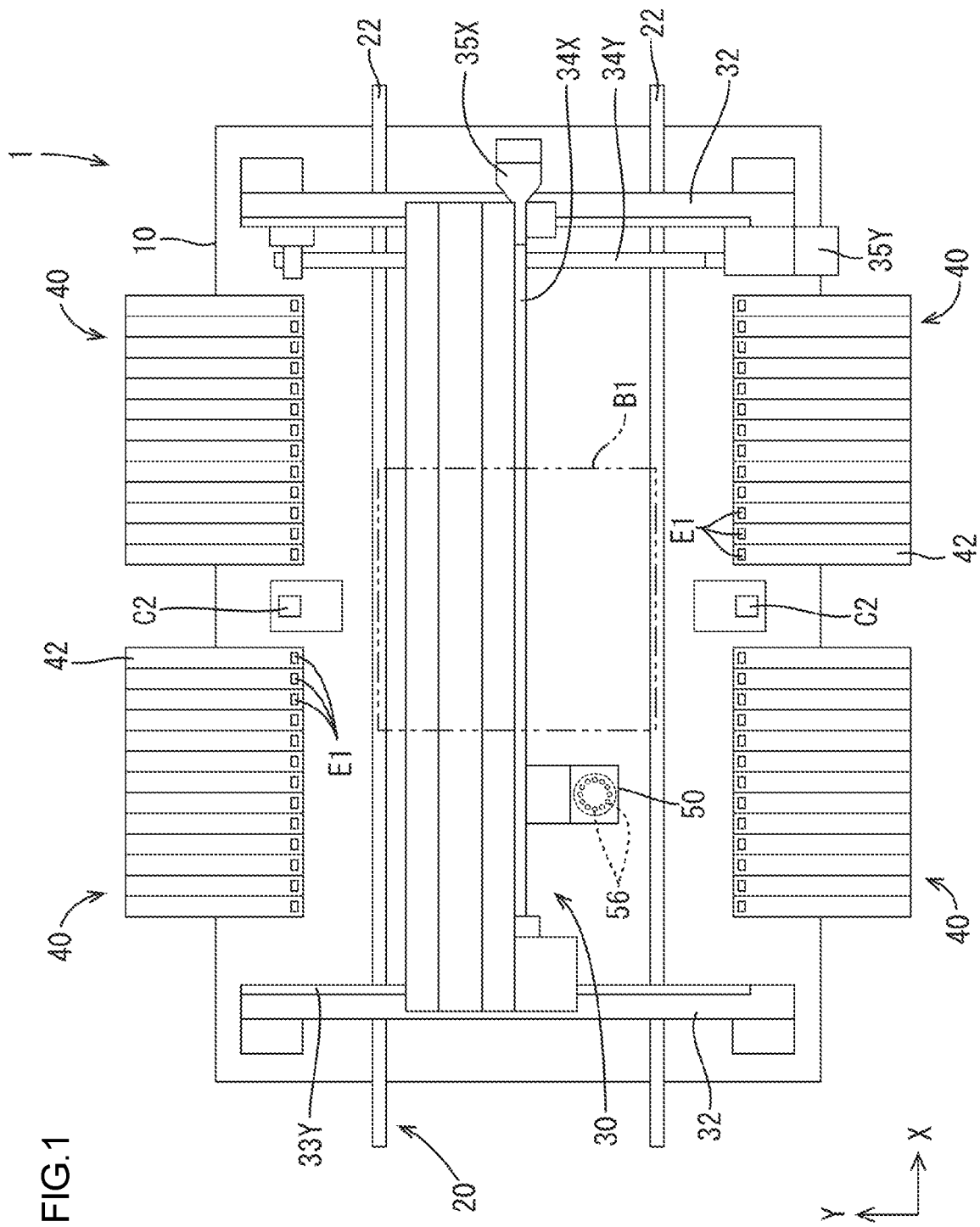
FIG. 1 is a plan view of a surface mounter.

An embodiment is described with reference to the drawings. In this embodiment, a surface mounter 1 illustrated in FIG. 1 is described as an example. The surface mounter 1 includes a base 10, a transfer conveyor (one example of a substrate transferring device) 20 configured to transfer a printed substrate (one example of a substrate) B1, a component mounting device 30 configured to mount an electronic component (one example of a component) E1 on the printed substrate B1, and a component feeding device 40 configured to feed the electronic component E1 to the component mounting device 30.

The base 10 has an oblong shape in plan view and has a flat upper surface. A backup plate (not illustrated) for supporting the printed substrate B1 during mounting of the electronic component E1 on the printed substrate B1 is provided below the transfer conveyor 20 on the base 10, for example. In the following description, the longitudinal direction of the base 10 (the left-right direction in FIG. 1) and the transfer direction of the transfer conveyor 20 are referred to as an X-axis direction. The width direction of the base 10 (the up-down direction in FIG. 1) is referred to as a Y-axis direction. The up-down direction of the base 10 (the up-down direction in FIG. 2) is referred to as a Z-axis direction.

The transfer conveyor 20 is located at the substantially middle of the base 10 in the Y-axis direction and is configured to transfer the printed substrate B1 in the transfer direction (the X-axis direction). The transfer conveyor 20 includes a pair of conveyor belts 22 configured to circulate in the transfer direction. The printed substrate B1 is positioned across the conveyor belts 22. The printed substrate B1 is transferred from one side in the transfer direction (the right side in FIG. 1) along the conveyor belt 22 to an operation position (an area surrounded by a two-dot chain line) where the printed substrate B1 is stopped for the mounting operation of the electronic component E1. Then, the printed substrate 1 is transferred along the conveyor 22 and is discharged through the other side (the left side in FIG. 1).

Two component feeding devices 40, which are feeder-type component feeding devices, are arranged side by side in the X-axis direction on each side of the transfer conveyor 20 (each side in the up-down direction in FIG. 1), i.e., the total of four component feeding devices 40. The component feeding devices 40 each include a plurality of feeders 42 arranged side by side. The feeders 42 each include a reel (not illustrated), around which a component feeding tape (not illustrated) holding the electronic components E1 is wound, and an electric unwinding device (not illustrated), which is configured to unwind the component feeding tape from the reel, for example. In the feeder 42, the electronic components E1 are fed one by one from a component feeding position at the end adjacent to the transfer conveyor.

The component mounting device 30 includes a pair of supporting frames 32, which is positioned above the base 10 and the component feeding devices 40 and is described later, a mounting head 50, which is a rotary type mounting head, and a mounting head driving mechanism configured to drive the mounting head 50. The component feeding device 40 is described later. The supporting frames 32 extending in the Y-axis direction are positioned at the both sides of the base 10 in the X-axis direction. The supporting frames 32 are provided with an X-axis servomechanism and a Y-axis servomechanism, which constitute the mounting head driving mechanism. The mounting head 50 is movable in the X-axis direction and the Y-axis direction over a predetermined motion region by using the X-axis servomechanism and the Y-axis servomechanism.

The Y-axis servomechanism includes Y-axis guide rails 33Y, Y-axis ball screws 34Y on each of which a ball nut (not illustrated) is threadably mounted, and a Y-axis servomotor 35Y. A head support fixed to a ball nut is attached to each Y-axis guide rail 33Y. The ball nut is moved forward or backward along the Y-axis ball screw 34Y when the Y-axis servomotor 35Y is energized. This moves the head support 36 fixed to the ball nut and the mounting head 50, which will be described later, in the Y-axis direction along the Y-axis guide rail 33Y.

The X-axis servomechanism includes an X-axis guide rail (not illustrated), an X-axis ball screw 34X on which a ball nut (not illustrated) is threadably mounted, and an X-axis servomotor 35X. The mounting head 50 is attached to the X-axis guide rail in a movable manner in the axial direction of the X-axis guide rail. The ball nut is moved forward or backward along the X-axis ball screw 34X when the X-axis servomotor 35X is energized. This moves the mounting head 50 fixed to the ball nut in the X-axis direction along the X-axis guide rail.

(Configuration of Mounting Head)

Figure 2:
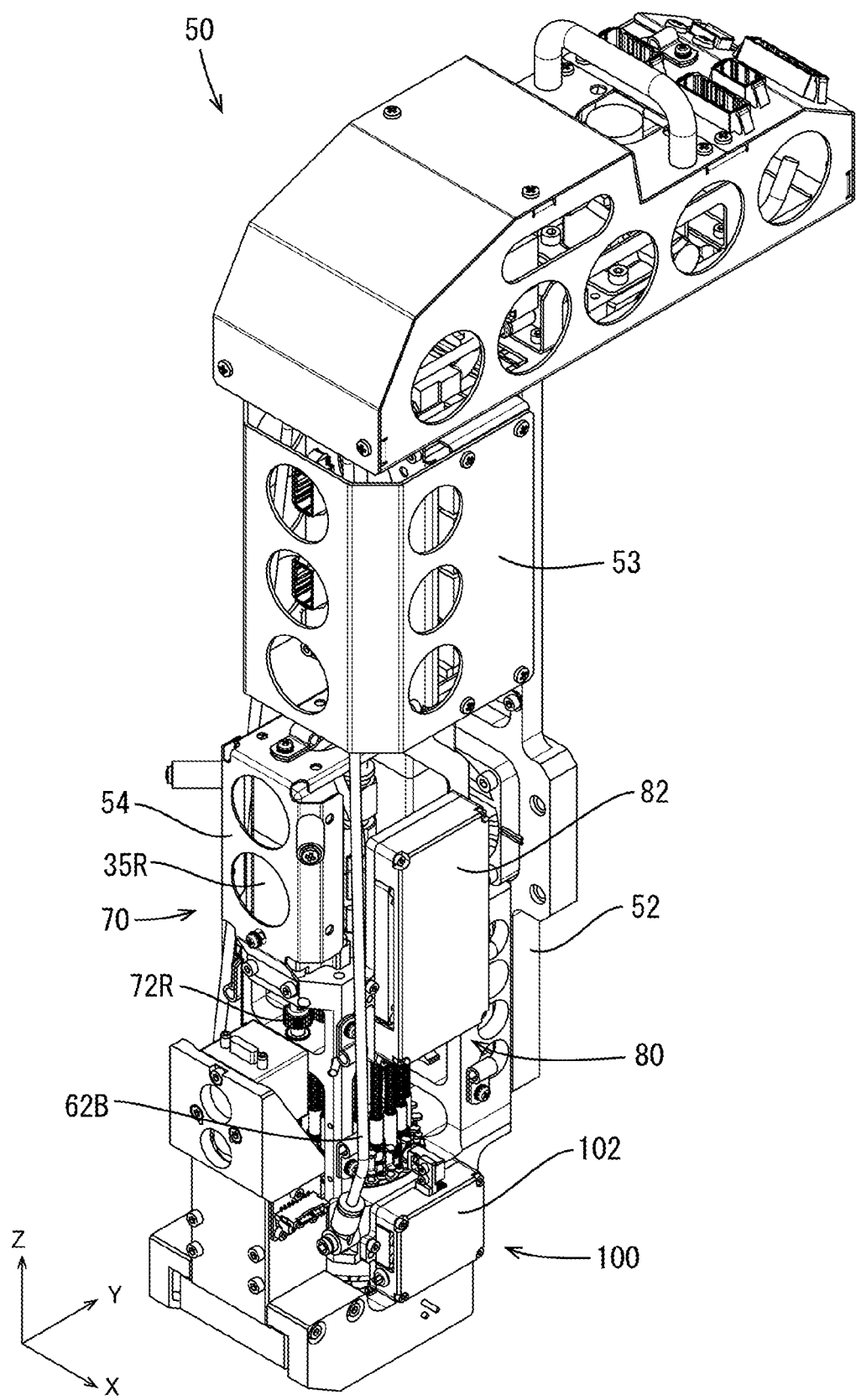
FIG. 2 is a perspective view of a mounting head.

Next, the configuration of the mounting head 50 is described in detail. As illustrated in FIG. 2, the mounting head 50 includes an arm-like shaped head body 52 covered by covers 53 and 54. The mounting head 50 is configured to hold the electronic component E1 fed by the component feeding device 40 by suction and mount the electronic component E1 on the printed substrate B1. The mounting head 50 in this embodiment is a rotary type mounting head and includes eighteen nozzle shafts 55, which are held by a rotary body 60 in a movable manner in the Z-axis direction (the up-down direction), at the front end portion (see FIG. 4).

Figure 4:
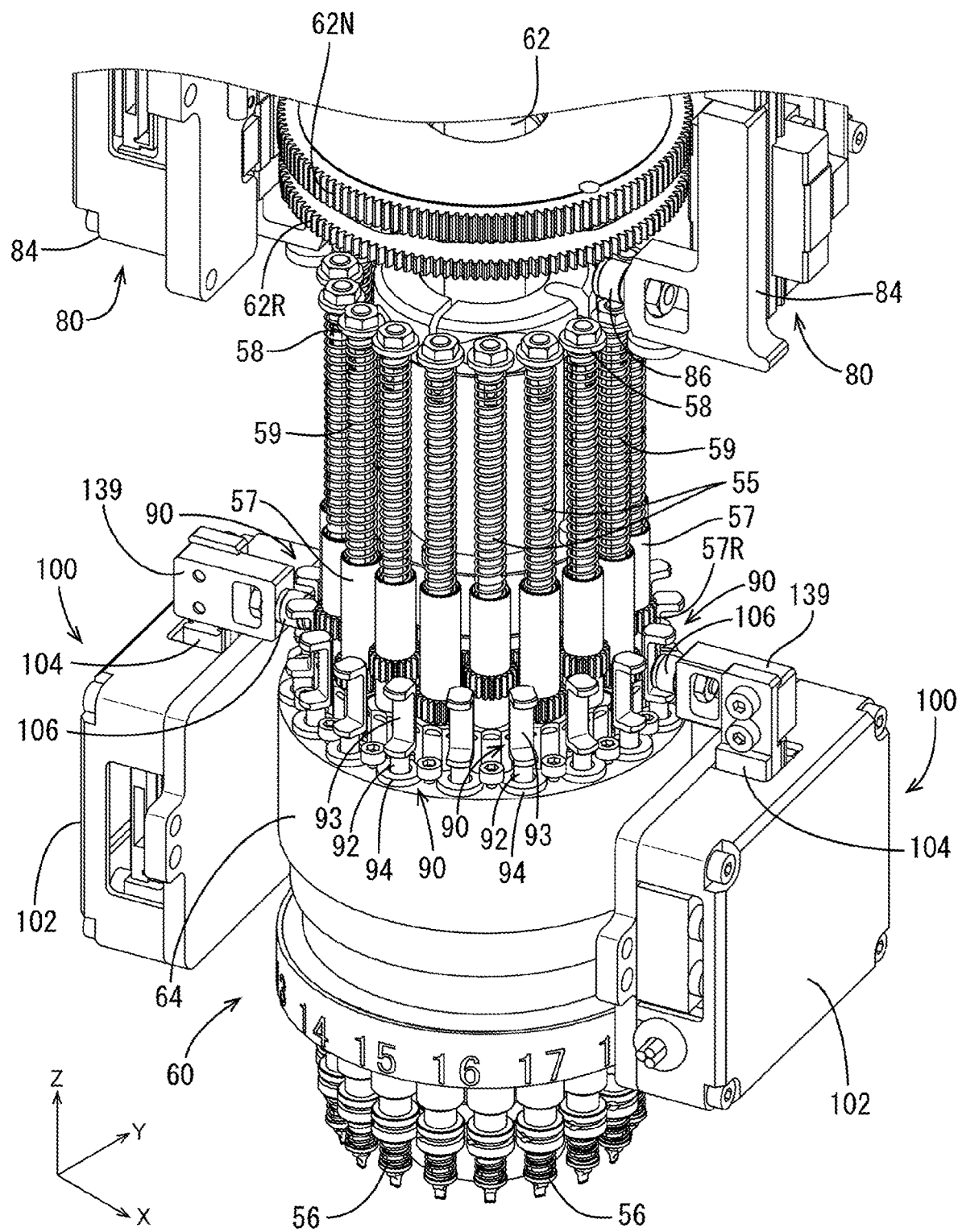
FIG. 4 is a perspective view corresponding to FIG. 3 and illustrating front end portions of the pickup nozzles in an exposed manner.

As illustrated in FIG. 4, the rotary body 60 includes a shaft 62 having a cylindrical shape extending in the Z-axis direction and a shaft retainer 64 disposed around the shaft 62 at a lower end of the mounting head 50. The shaft retainer 64 has a substantially cylindrical shape larger in diameter than the shaft 62. The shaft 62 of the rotary body 60 is supported by the head body 52 in a rotatable manner about the axis of the shaft 62. The shaft 62 has a two-layered structure. An N-axis driven gear 62N is provided coaxially with the shaft 62 at an upper portion of the inner shaft 62, and an R-axis driven gear 62R is provided coaxially with the shaft 62 at an upper portion of the outer shaft 62 (see FIG. 4).

An N-axis drive unit (not illustrated) configured to rotate the rotary body 60 is disposed at the substantially middle in the Z-axis direction of the mounting head 50. The N-axis drive unit includes a N-axis servomotor 35N (see FIG. 7) and an N-axis driving gear (not illustrated) disposed around the output shaft of the N-axis servomotor 35N. The N-axis driving gear and the N-axis driven gear 62N are engaged together. When the N-axis servomotor 35N is energized, the rotary body 60 is rotated by a predetermined angle about the axis extending in the Z-axis direction by the rotation of the N-axis driving gear and the N-axis driven gear 62N.

Figure 5:
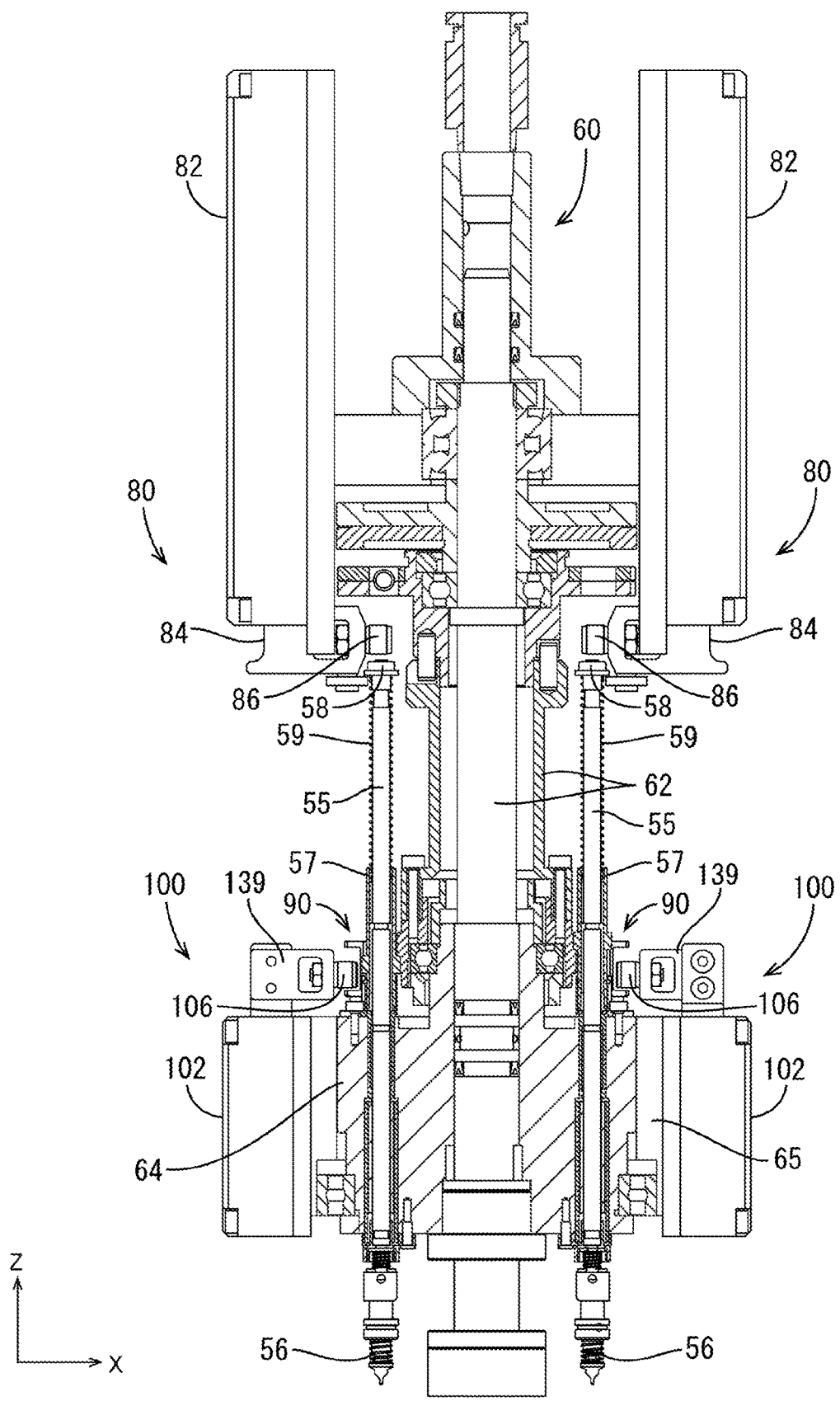
FIG. 5 is a cross-sectional view of main components of the mounting head.

The shaft retainer 64 of the rotary body 60 has eighteen through holes at a predetermined interval in the circumferential direction. Nozzle shafts 55 each having a cylindrical shape are held in the through holes to extend in the Z-axis direction through the shaft retainer 64. The nozzle shafts 55 pass through tubular shaft holders 57. As illustrated in FIG. 4 and FIG. 5, pickup nozzles 56 configured to hold the electronic components E1 by suction are provided at lower end portions of the nozzle shafts 55 protruding downward from the shaft retainer 64.

The pickup nozzles 56 are each configured to receive a negative pressure or a positive pressure. The pickup nozzles 56 are each configured to hold the electronic component E1 by suction at the front end by means of a negative pressure and to release the electronic component E1 held at the front end by means of a positive pressure. When the rotary body 60 is rotated by the N-axis drive unit, the pickup nozzles 56 provided at the nozzle shafts 55 are turned together with the nozzle shafts 55 about the axis of the rotary body 60.

As illustrated in FIG. 2, an R-axis drive unit 70 configured to rotate the nozzle shafts 55 about the respective axes is disposed at the substantially middle in the Z-axis direction of the mounting head 50. The R-axis drive unit 70 includes an R-axis servomotor 35R and an R-axis driving gear 72R (see FIG. 3) disposed around the output shaft of the R-axis servomotor 35R and engaged with an R-axis driven gear 62R. A common gear (not illustrated) is disposed on the outer shaft 62, on which the R-axis driven gear 62R is disposed, at a position below the R-axis driven gear 62R.

As illustrated in FIG. 4, nozzle gears 57R are disposed on the outer circumferences of the shaft holders 57. The nozzle gears 57R on the shaft holders 57 are engaged with the above-described common gear. When the R-axis servomotor 35R is energized, the common gear is rotated by the rotation of the R-axis driving gear 72R and the R-axis driven gear 62R. The rotation of the common gear rotates the shaft holders 57 due to the engagement with the nozzle gears 57R. The shaft holders 57 are connected to the corresponding nozzle shafts 55 through a ball spline mechanism, and thus the rotation of the common gear rotates the eighteen nozzle shafts 55 about the respective axes by the same angle in the same direction at the same time.

Spring retaining bolts 58 are threadably engaged with the upper ends of the nozzle shafts 55. A spiral spring 59 is disposed around the outer surface of each nozzle shaft 55. The spiral spring 59 is compressed between the spring retaining bolt 58 and the shaft holder 57. The nozzle shaft 55 is biased upward by an elastic force of the spiral spring 59.

Figure 3:
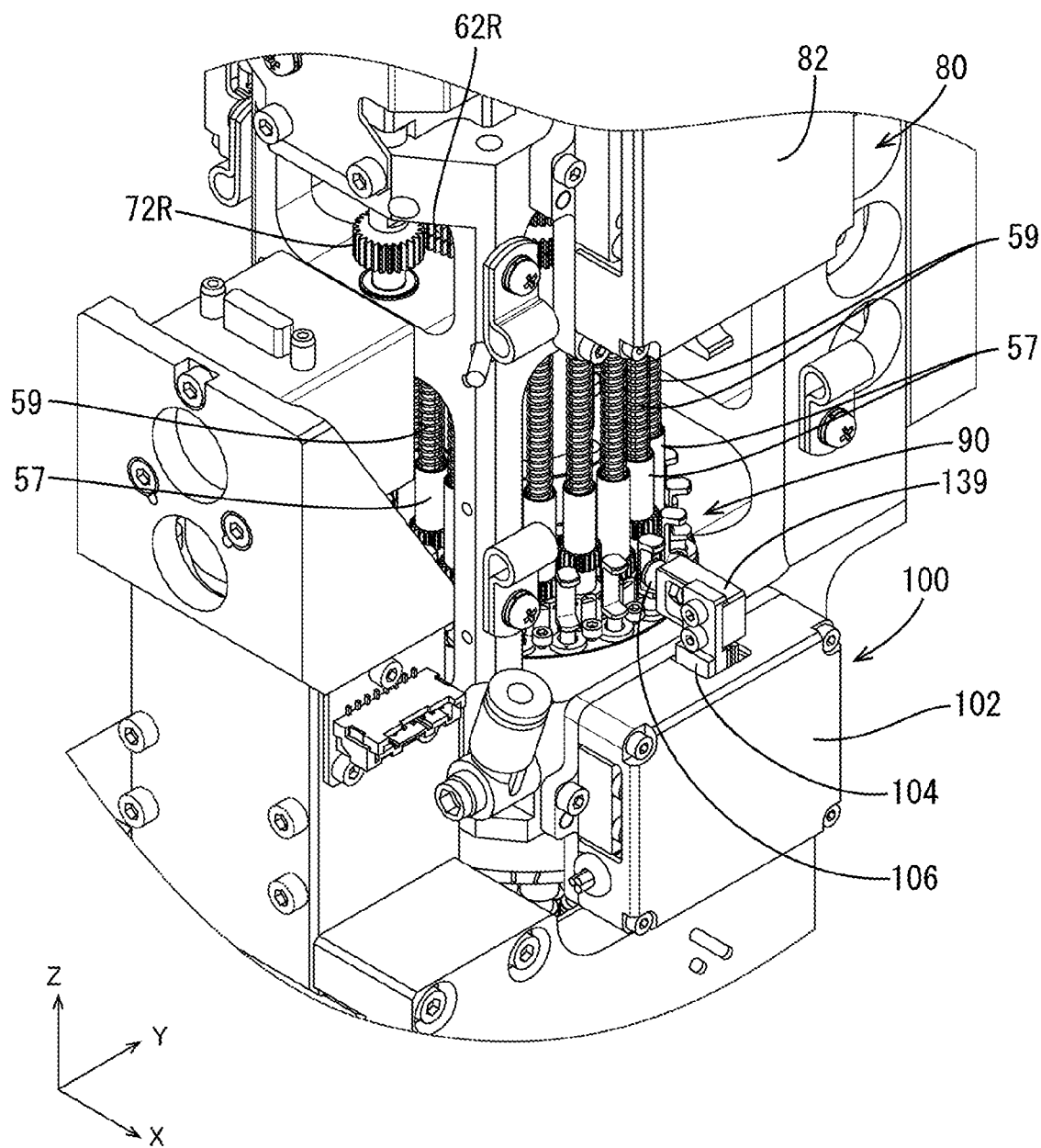
FIG. 3 is a magnified perspective view of a portion of the mounting head.

As illustrated in FIG. 2 to FIG. 4, the mounting head 50 includes two Z-axis drive units 80 configured to move up and down the nozzle shafts 55 at predetermined positions of the eighteen nozzle shafts 55 relative to the rotary body 60 along the shaft 62 of the rotary body 60 (in the z-axis direction or the up-down direction). The Z-axis drive units 80 are symmetrically arranged above the nozzle shafts 55 (see FIG. 5) at the left and right sides of the mounting head 50 with the shaft 62 of the rotary body 60 therebetween.

As illustrated in FIG. 3 to FIG. 5, the Z-axis drive units 80 each include a Z-axis drive source 82 having a box-like shape and a Z-axis movable portion 84 configured to move in the Z-axis direction (the up-down direction) by using power from the Z-axis drive source 82. The Z-axis drive source 82 includes a Z-axis linear motor 35Z (see FIG. 7) configured to drive the Z-axis movable portion 84 by a linear force.

As illustrated in FIG. 4 and FIG. 5, a cam follower 86 (hereinafter, referred to as a "Z-axis cam follower 86") is attached to the lower end of the Z-axis movable portion 84 of the Z-axis drive unit 80 in a rotatable manner about the axis extending in the X-axis direction. The Z-axis movable portion 84 that has been moved up to the upward end is held by the Z-axis drive source 82 in such a manner that the Z-axis cam follower 86 is located near the upper end of the nozzle shaft 55 (the spring retaining bolt 58) that is located at a predetermined position (see FIG. 5). When the Z-axis movable portion 84 is positioned at the upward end, the nozzle shafts 55 are able to turn around the shaft 62.

When the Z-axis movable portion 84 at the upward end is moved down by the Z-axis drive unit 82, the Z-axis cam follower 86 comes in contact with the upper end of the nozzle shaft 55 that is located at the predetermined position, and the nozzle shaft 55 is moved down against the elastic force of the spiral spring 59. When the nozzle shaft 55 is moved down, the pickup nozzle 56 attached to the nozzle shaft 55 is moved down such that the front end of the pickup nozzle 56 is located close to the printed substrate B1 positioned at a component supply position or an operation position of the component feeding device 40. When the Z-axis movable portion 84 in this state is moved up, the nozzle shaft 55 and the pickup nozzle 56 are moved up by an elastic restoring force of the spiral spring 59.

As illustrated in FIG. 4 and FIG. 5, the mounting head 50 further includes switching devices 90 configured to switch the pressure applied to the pickup nozzles 56 between a negative pressure and a positive pressure. Eighteen switching devices 90 are provided so as to correspond to the pickup nozzles 56 (the nozzle shafts 55).

The switching devices 90 are disposed outwardly of the nozzle shafts 55, which are arranged in a circular shape, at positions between adjacent nozzle shafts 55. The switching devices 90 are arranged in a circular shape along the outer circumference of the shaft retainer 64 at an equal interval (see FIG. 4) as the nozzle shafts 55.

As illustrated in FIG. 4 and FIG. 5, the switching devices 90 each include a valve spool (one example of a shaft member) 92 and a sleeve (one example of a housing member) 94 housing the lower portion of the valve spool 92. The sleeves 94 are attached to mounting holes in the shaft retainer 64. Specifically described, the whole sleeve 94 except a large-diameter portion 98 at the top is inserted into the mounting hole. The lower portion of the valve spool 92 (most of the valve spool 92 other than a contact portion 93) is housed in the sleeve 94 through the upper opening exposed at the shaft retainer 64 in a movable manner in the axial direction.

The valve spools 92 are disposed in the sleeves 94 with the axial direction thereof being oriented in the Z-axis direction (the up-down direction). The valve spools 92 moved in the axial direction (the up-down direction) switches the pressure applied to the pickup nozzles 56 between a negative pressure and a positive pressure.

Figure 6:
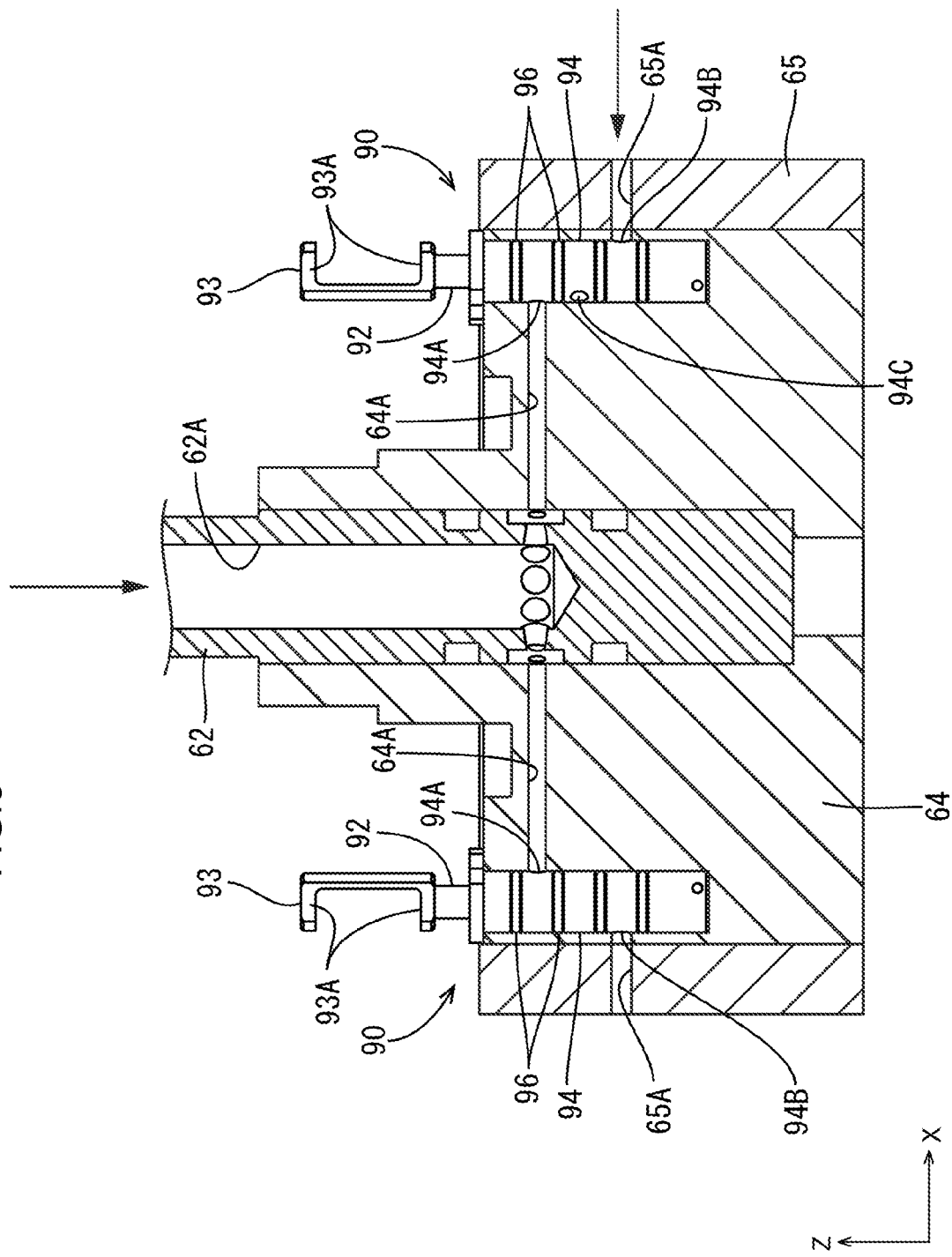
FIG. 6 is a cross-sectional view illustrating a portion of a front end portion (a lower end portion) of the mounting head. In the cross-sectional view, a valve spool is positioned at a positive pressure application position.

As illustrated in FIG. 5 and FIG. 6, the valve spools 92 each have a contact portion 93 having a laterally facing U-like shape at the upper portion. The contact portion 93 has two opposing portions 93A extending in a direction perpendicular to the axial direction of the valve spool 92 (the Z-axis direction) and facing each other with a space therebetween in the axial direction (the Z-axis direction) (see FIG. 6). The contact portion 93 protrudes upward from the sleeve 94. The valve spools 92 are each arranged such that the opening of the U-like shaped contact portion 93 faces to the outer side (the side opposite the shaft 62) (see FIG. 4).

In the switching device 90, the valve spool 92 in the sleeve 94 is moved to the upward end (hereinafter referred to as a "negative pressure application position"), which is indicated by a two-dot chain line in FIG. 8 to apply a negative pressure to the sleeve 94. The valve spool 92 is moved to a downward end (hereinafter referred to as a "positive pressure application position"), which is indicated by a solid line in FIG. 8 to apply a positive pressure to the sleeve 94. The negative pressure or the positive pressure applied to the sleeves 94 is applied to the corresponding pickup nozzles 56 through supply passages (not illustrated).

Here, the supply passages for applying a negative or positive pressure to the sleeves 94 and how a negative or positive pressure is applied in the mounting head 50 is described. As illustrated in FIG. 6, the sleeves 94 each include a negative pressure inlet port 94A through which a negative pressure come in, a positive pressure inlet port 94B through which a positive pressure come in, and an outlet port (not illustrated) through which the negative or positive pressure came in through the negative pressure inlet port 94A or the positive pressure inlet port 94B leaves. The outlet ports are in communication with the corresponding pickup nozzles 56.

The inner shaft 62 has a first negative pressure supply passage 62A therein to which a negative pressure is applied. A first positive pressure supply passage 62B to which the positive pressure is applied is provided at the outer side of the rotary body 60 (see FIG. 2). In addition, a plurality of second negative pressure supply passages 64A into which a negative pressure is applied are provided in the shaft retainer 64 at positions corresponding to the sleeves 94. Furthermore, two second positive pressure supply passages 65A in communication with the first positive pressure supply passage 62B are provided in an outer ring member 65, which is disposed outwardly of the shaft retainer 64, such that a positive pressure is applied thereto.

The first negative pressure supply passage 62A is always in communication with all the second negative pressure supply passages 64A at the lower end, regardless of the rotation of the shaft 62. Furthermore, when the valve spools 92 are positioned at the negative pressure application position, the second negative pressure supply passages 64A are in communication with the corresponding negative pressure inlet ports 94A of the sleeves 94 housing the valve spools 92. When the valve spools 92 are positioned at the negative pressure application position, a negative pressure is constantly applied to the pickup nozzles 56 corresponding to the valve spools 92 (the switching devices 90) through the outlet ports, regardless whether the pickup nozzles 56 are turning about the axis of the rotary body 60.

The two second positive pressure supply passages 65A are provided in the outer ring member 65, which is disposed outwardly of the shaft retainer 64, at positions corresponding to the predetermined positions where the nozzle shafts 55 are moved up or down in the Z-axis direction by the Z-axis drive units 80. While the valve spools 92 corresponding to the pickup nozzles 56 at the predetermined positions are each located at the positive pressure application position, the second positive pressure supply passages 65A are in communication with the positive pressure inlet ports 94B of the sleeves 94 housing the valve spools 92. Thus, with the valve spools 92 being located at the positive pressure application position, a positive pressure is applied to the pickup nozzles 56 through the outlet ports only when the pickup nozzles 56 corresponding to the valve spools 92 are positioned at the predetermined position.

In the mounting head 50, as described above, a negative pressure is constantly applied to the pickup nozzle 56 corresponding to the valve spool 92 at the negative pressure application position. Thus, the electronic component E1 held by the pickup nozzle 56 by suction is less likely to fall during movement of the mounting head 50, for example. Furthermore, as described above, a positive pressure is applied to the pickup nozzle 56 corresponding to the valve spool 92 at the positive pressure application position only in a predetermined case. Thus, only the target electronic component E1 is mounted on the printed substrate B1 by using the positive pressure.

Figure 8:
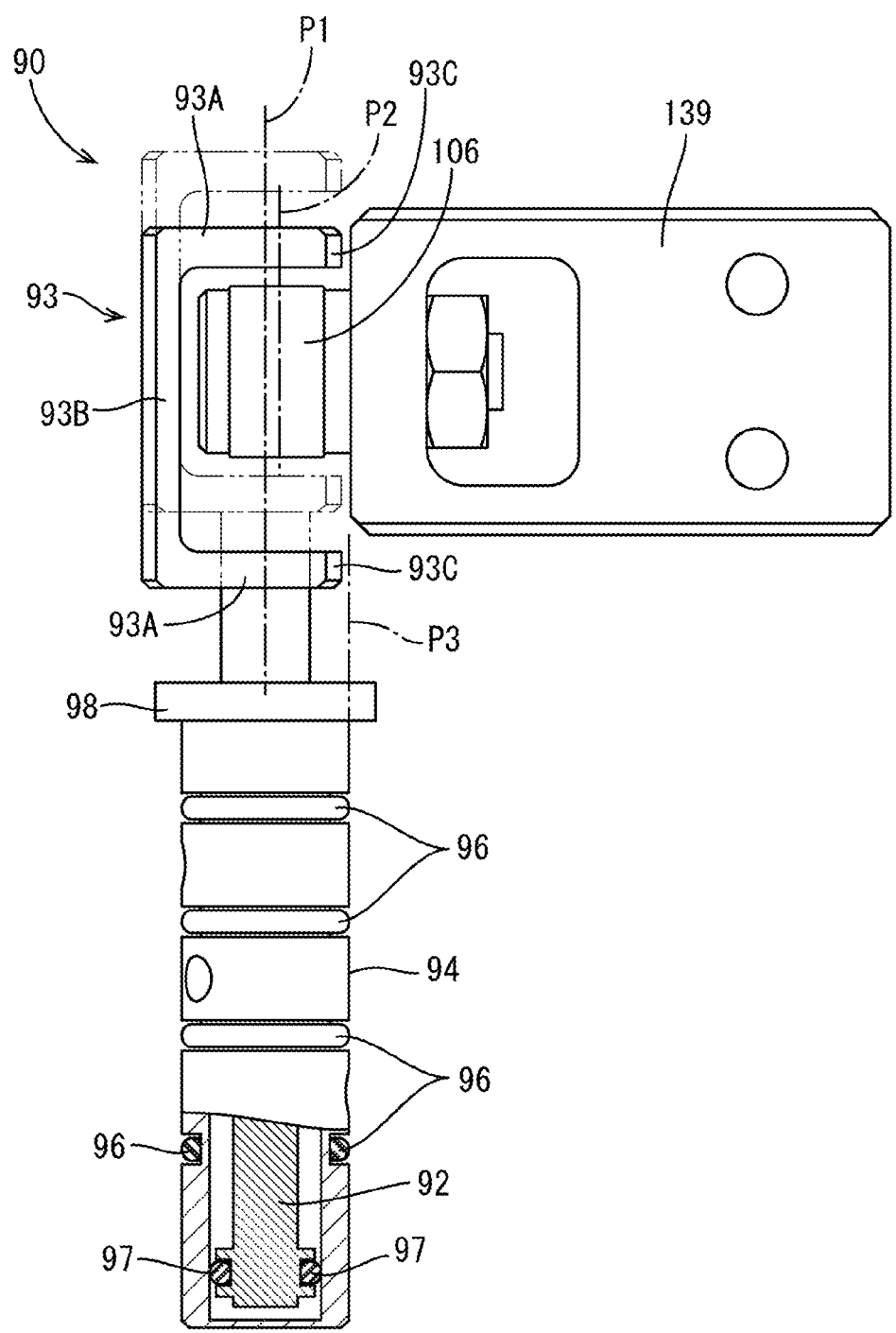
FIG. 8 is a front view illustrating how the valve spool moves.

As illustrated in FIG. 8, outer sealing members 96 are disposed on the outer surface of each sleeve 94 with a space therebetween in the Z-axis direction. The outer sealing members 96 are circular rings formed of an elastic material such as rubber and are configured to seal the mounting hole of the shaft retainer 64. In addition, inner sealing members 97 are arranged in the axial direction on the inner surface of the sleeve 94 (only one of the inner sealing members 97 at the lower position is indicated in FIG. 8). The inner sealing member 97 is a circular ring formed of an elastic material such as rubber and is attached to the outer surface of the valve spool 92 as illustrated in FIG. 8. The inner sealing members 97 seals between the inner surface of the sleeve 94 and the valve spool 92. This reduces the negative pressure leakage or the positive pressure leakage at the negative pressure inlet port 94A, the positive pressure inlet port 94B, and the outlet port. Furthermore, the inner sealing members 97 keep the valve spools 92 that has been moved to the negative pressure application position or the positive pressure application position at that position by the friction force.

As illustrated in FIG. 2 to FIG. 4, the mounting head 50 includes two V-axis drive units 100 configured to move the valve spool 92 of each switching device 90 between the negative pressure application position and the positive pressure application position in the Z-axis direction (the up-down direction). The two V-axis drive units 100 are disposed at positions corresponding to the two Z-axis drive units 80 in the Z-axis direction (see FIG. 5) and configured to move the valve spools 92 of the switching devices 90 corresponding to the pickup nozzles 56 at the predetermined positions. Thus, the two V-axis drive units 100 are also symmetrically arranged with the shaft 62 of the rotary body 60 therebetween at the left and right sides of the mounting head 50 as the two Z-axis drive units 80.

As illustrated in FIG. 3 to FIG. 5, and FIG. 9, the V-axis drive units 100 each include a V-axis drive source (one example of a drive source) 102 having a box-like shape and a V-axis movable portion (one example of a movable portion) 104 configured to move in the Z-axis direction (the up-down direction) by using power from the V-axis drive source 102. The V-axis drive source 102 includes a V-axis linear motor 35V (see FIG. 7) for driving the V-axis movable portion 104 by a linear force therein.

Figure 9:
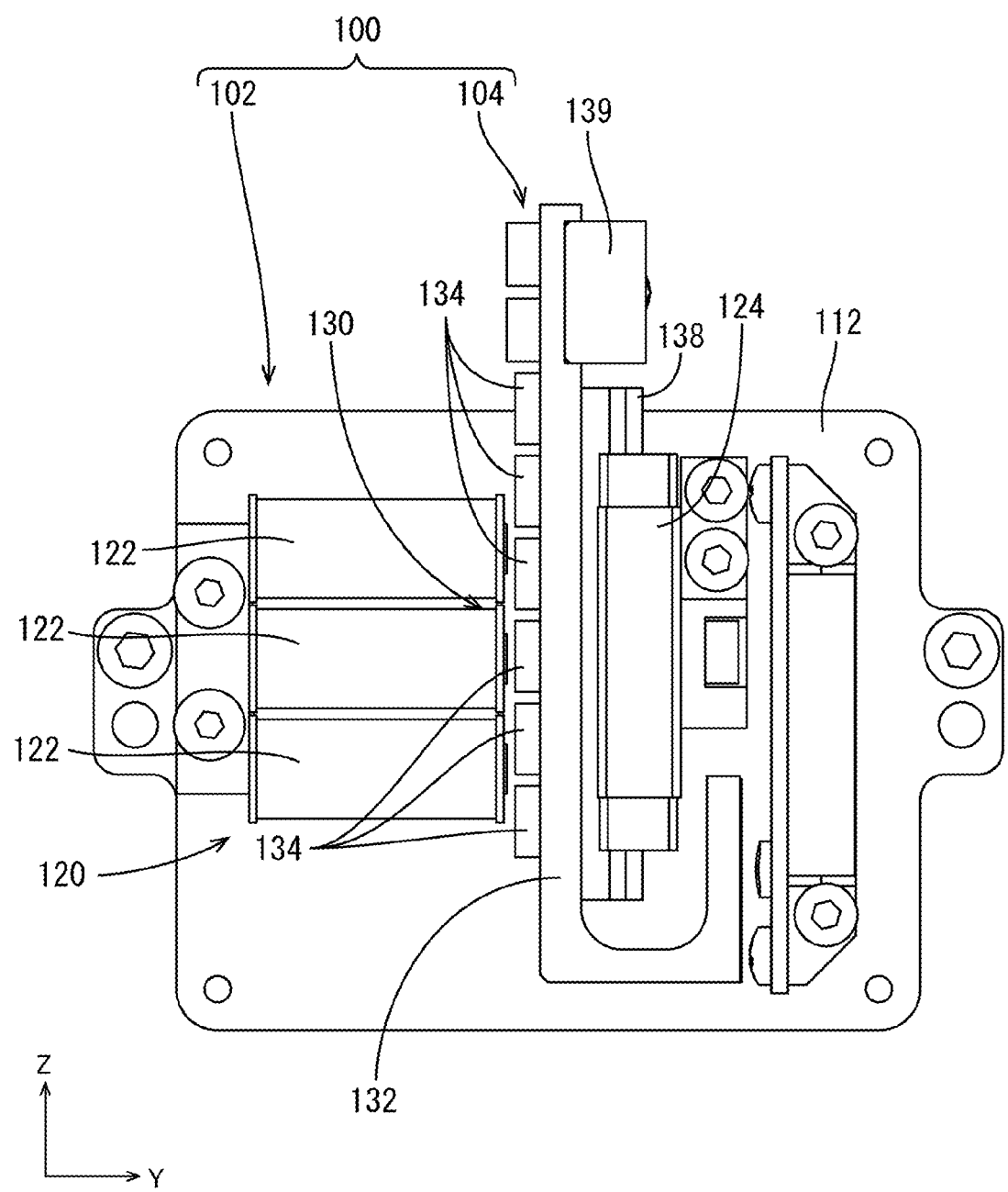
FIG. 9 is a side view illustrating an internal configuration of a V-axis drive unit.

As illustrated in FIG. 9, the V-axis drive source 102 includes a V-axis body 112 having a planar shape and a stator 120. The stator 120 includes three armature coils 122 arranged in the Z-axis direction on the surface of the V-axis body 112.

As illustrated in FIG. 9, the V-axis movable portion 104 includes a yoke 132, a mover 130 disposed on a front surface of the yoke 132, and a cam follower support 139 disposed on the upper portion of the yoke 132. The mover 130 includes permanent magnets 134 on the front surface (a surface facing the stator 120) of the yoke 132. The permanent magnets 134 are arranged in a straight line extending in the Z-axis direction with a predetermined distance therebetween such that adjacent magnetic poles of the permanent magnets 134 are different from each other.

The stator 120 and the mover 130 constitute a linear motor. When a current is applied to the armature coils 122 of the stator 120, a driving force for moving the V-axis movable portion 104 in the Z-axis direction (the up-down direction) is generated between the stator 120 and the mover 130. The reference numerals 124 and 138 in FIG. 9 respectively denote a rail and a rail guide. The rail 124 and the rail guide 138 are configured to guide the yoke 132 in the Z-axis direction.

As illustrated in FIG. 4 and FIG. 5, a cam follower 106 (hereinafter, referred to as a "V-axis cam follower 106") is attached to the cam follower support 139 on the V-axis movable portion 104 in a rotatable manner about the axis extending in the X-axis direction. When the V-axis drive unit 100 is energized, the V-axis movable portion 104 is positioned such that the V-axis cam follower 106 is held between the opposing portions 93A of the valve spool 92 corresponding to the nozzle shaft 55 at the predetermined position (see FIG. 5).

When the V-axis movable portion 104 is moved up by the V-axis drive source 102, the V-axis cam follower 106 comes in contact with the upper one of the two opposing portions 93A positioned on the both sides of the V-axis cam follower 106 and moves up the valve spool 92 to the negative pressure application position (one example of a first movement operation). When the V-axis movable portion 104 is moved down by the V-axis drive source 102, the V-axis cam follower 106 comes in contact with the lower one of the two opposing portions 93A on the both sides of the V-axis cam follower 106 and moves down the valve spool 92 to the positive pressure application position (one example of a second movement operation). In this embodiment, the V-axis drive unit 100 is one example of a drive unit.

Since the rotation axis of the V-axis cam follower 106 extends in the X-axis direction, the rotation direction of the V-axis cam follower 106 is substantially the same as the tangential direction of the circular trajectory of the nozzle shafts 55 turned by the rotary body 60. Thus, when the rotary body 60 is rotated while the valve spool 92 is moved up or down by the V-axis cam follower 106, the V-axis cam follower 106 is rotated by a frictional force generated between the V-axis cam follower 106 and the opposing portion 93A while being in contact with the opposing portion 93A. Thus, the valve spool 92 is able to be moved up or down with the nozzle shafts 55 being kept turned.

Figure 7:
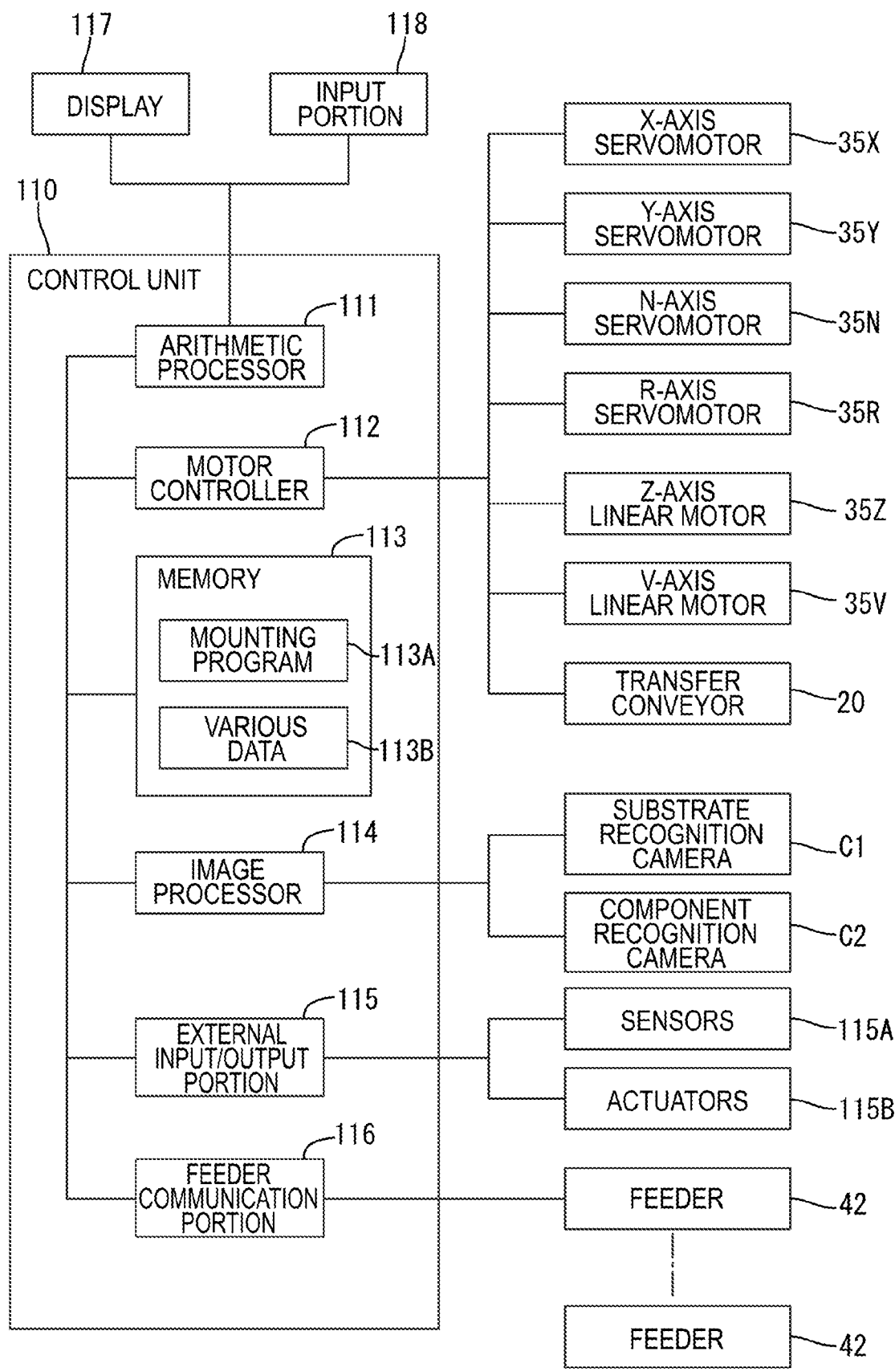
FIG. 7 is a block diagram indicating an electrical configuration of the surface mounter.

Furthermore, the mounting head 50 is provided with a substrate recognition camera C1 (see FIG. 7). The substrate recognition camera C1 is configured to move together with the mounting head 50 and capture an image of a predetermined portion of the printed substrate B1 stopped at the operation position. In addition, component recognition cameras C2 (see FIG. 1) are fixed to the base 10 at positions near the operation position. The component recognition cameras C2 are configured to capture an image of the electronic component E1 held by the pickup nozzle 56 by suction at the component feeding position of the component feeding device 40.

(Electrical Configuration of Surface Mounter)

Next, an electrical configuration of the surface mounter 1 is described with reference to FIG. 7. The entire of the surface mounter 1 is controlled by a control unit 110. The control unit 110 includes an arithmetic and control unit 111 such as a CPU. A motor controller 112, a memory 113, an image processer 114, an external input/output portion 115, a feeder communication portion 116, a display 117, and an input portion 118 are connected to the arithmetic and control unit 111.

The motor controller 112 is configured to drive the X-axis servomotor 35X and the Y-axis servomotor 35Y of the component mounting device 30 in accordance with a mounting program 113A, which will be described later, and drive the N-axis servomotor 35N, the R-axis servomotor 35R, the Z-axis linear motor 35Z, and the V-axis linear motor 35V of the mounting head 50. In addition, the motor controller 112 is configured to drive the transfer conveyor 20 in accordance with the mounting program 113A.

The memory 113 includes a Read Only Memory (ROM) configured to store programs or the like for controlling the CPU and Random Access Memory (RAM) configured to temporally store various data during the operation. The memory 113 stores the mounting program 113A, which will be described later, and various data 113B.

Specifically described, the mounting program 113A stored in the memory 113 includes substrate information relating to the production number of printed substrates B1, which are mounting targets, component information relating to the number or type of electronic components E1 to be mounted on the printed substrate B1, and mounting information relating to a mounting position of the electronic component E1 on the printed substrate B1, for example. The various data 113B stored in the memory 113 include data relating to the number or type of the electronic components E1 held by the feeders 42 of the component feeding device 40.

The image processor 114 is configured to receive imaging signals output from the substrate recognition camera C1 and the component recognition camera C2. The image processor 114 is configured to analyze the image of the component and the image of the substrate by using the imaging signals provided by the cameras C1 and C2.

The external input/output portion 115 is an interface and is configured to receive detection signals from various sensors 115A provided in the body of the surface mounter 1. In addition, the external input/output portion 115 is configured to control the operation of actuators 115B by using control signals output from the arithmetic processor 111.

The feeder communication portion 116 is connected to the controller of each feeder 42 of the component feeding device 40 to collectively control the feeders 42. The controller of each feeder 42 is configured to control the motor for sending out the component feeding tape.

The display 117 is a liquid crystal display device having a display screen, for example, and is configured to display the state of the surface mounter 1 on the display screen. The input portion 118 is a key board, for example, and is configured to receive external manual input.

The surface mounter 1 having the above-described configuration alternately performs a transferring operation in which the printed substrate B1 is transferred by the transfer conveyor 20 and a mounting operation in which the electronic component E1 transferred to the operation position of the base 10 is mounted on the print board B1.

(Configuration and Movement of Valve Spool 92)

Next, the configuration of the contact portion 93 of the valve spool 92 and the movement of the valve spool 92 are described in detail with reference to FIG. 8. The contact portion 93 of each valve spool 92, which has the laterally facing U-like shape, includes the two opposing portions 93A facing each other in the Z-axis direction and the connection portion 93B. As illustrated in FIG. 8, the connection portion 93B connects the opposing portions 93A at a position away from the central axis P1 of the valve spool 92 (at a position away from the central axis P1 to the left in FIG. 8). The opposing portions 93A extend horizontally from the connection portion 93B and have ends 93C at positions away from the central axis P1 of the valve spool 92 toward the side opposite the connection portion 93B (to the right in FIG. 8). The contact portion 93 has a shape recessed in an insertion direction in which the V-axis cam follower 106 is inserted (to the left in FIG. 8). The V-axis cam follower 106 is positioned on the central axis P1 of the valve spool 92 at a position between the opposing portions 93A. More specifically described, the V-axis cam follower 106 is positioned close to the connection portion 93B, i.e., the end of the V-axis cam follower 106 is positioned away from the central axis P1 to the left to a position close to the connection portion 93B.

When the V-axis movable portion 104 is moved up, the central portion of the V-axis cam follower 106 in the thickness direction (the center in the left-right direction in FIG. 8 and indicated by a central line P2) comes in contact with the lower surface of the upper one of the two opposing portions 93A and moves up the valve spool 92 together with the contact portion 93 to the negative pressure application position (indicated by a two-dot chain line in FIG. 8). When the V-axis movable portion 104 is moved down, the central portion of the V-axis cam follower 106 in the thickness direction (the center in the left-right direction in FIG. 8 and indicated by the central line P2) comes in contact with the upper surface of the lower one of the opposing portions 93A and moves down the valve spool 92 together with the contact portion 93 to the positive pressure application position (indicated by a solid line in FIG. 8).

In the mounting head 50, since the V-axis cam follower 106 is positioned on the central axis P1 of the valve spool 92 and is positioned close to the connection portion 93B, the central axis P1 of the valve spool 92 and the central axis P2 of the V-axis cam follower 106 are positioned close to each other, as illustrated in FIG. 8. Thus, the central portion of the V-axis cam follower 106 (the central portion in the thickness direction) comes in contact with the opposing portion 93A at a position close to the central axis P1 of the valve spool 92.

Furthermore, as illustrated in FIG. 8, the ends 93C of the opposing portions 93A are located inwardly from an outline P3 of the sleeve 94 toward the central axis P1 of the valve spool 93 (to the left in FIG. 8). This provides the following advantage.

As illustrated in FIG. 4, the valve spool 92 is attached to the shaft retainer 64 with the ends 93C of the opposing portions 93A facing to the outer side (facing away from the center of the shaft 62). In this configuration, if the valve spool 92 is positioned outwardly from the outline P3 of the sleeve 94, rotational moment of inertia about the shaft 62 increases due to a large amount of portion protruding to the outer side. In contrast, the ends 93C of the opposing portions 93A of the embodiment are located inwardly from the outline P3 of the sleeve 94 toward the central axis P1. Thus, compared with the configuration in which the ends 93C are positioned outwardly from the outline P3, the rotational moment of inertia about the shaft 62 is small. This allows the rotary body 60 including the eighteen nozzle shafts 55 and the shaft retainers 64 to rotate at a higher speed. The outline P3 of the sleeve 94 is an outline of the body of the sleeve 94 (a cylindrical portion except the large diameter portion 98 at the top).

As described above, in the mounting head 50 according to the embodiment, the switching device 90 and the V-axis drive unit 100 enable one V-axis cam follower 106 to move the valve spool 92 to the negative pressure application position and the positive pressure application position. In this configuration, the number of V-axis cam follower 106 provided on the V-axis movable portion 104 is minimized to one, and the switching between the negative pressure and the positive pressure is performed by the one cam follower 106. This requires a lower production cost than the conventional mounting head that uses a plurality of cam followers 106 for the switching between the negative pressure and the positive pressure (a mounting head configured to move up and down the valve spool by using two cam followers, for example).

The distance between the central line P2 of the V-axis cam follower 106 and the central axis P1 of the valve spool 92 may be large. In such a case, during the up-down movement of the valve spool 92, a moment is generated about a border between a portion of the valve spool 92 housed in the sleeve 94 and a portion of the valve spool 92 not housed in the sleeve 94 with a portion of the opposing portion 93A in contact with the V-axis cam follower 106 as a point of application, in addition to a traveling force in the axial direction of the valve spool 92.

This forces the valve spool 92 to tilt, and thus a portion of the inner sealing member 97 is locally pressed between the tilted valve spool 92 and the sleeve 94. This causes the portion of the inner sealing member 97 to be unevenly abraded and worn sooner by the valve spool 92 moved in and out the sleeve 94.

Compared with this configuration, in the mounting head 50 according to the embodiment, as described above, the V-axis cam follower 106 of the mounting head 50 is positioned on the central axis P1 of the valve spool 92 and is positioned close to the connection portion 93B. Thus, as illustrated in FIG. 8, the central axis P1 of the valve spool 92 and the central line P2 of the V-axis cam follower 106 are located close to each other, and the central portion of the V-axis cam follower 106 (the central portion in the thickness direction) comes in contact with the opposing portion 93A at the position close to the central axis P1 of the valve spool 92. Thus, the valve spool 92 is less likely to be tilted, reducing a decrease in service life of the seal ring 96 caused by the uneven abrasion of the portion of the seal ring 96. This increases the service life of the switching device 90 configured to switch the pressure applied to the mounting head 50 and increases durability of the mounting head 50.

Other Embodiments

The present disclosure is not limited to the embodiment described above and illustrated by the drawings. For example, the following embodiments will be included in the technical scope of the present disclosure.

(1) In the example of the above-described embodiment, the contact portion 93 of the valve spool 92 has a laterally facing U-like shape, but the shape of the contact portion 93 is not limited to this. The contact portion 93 may have any shape having two opposing portions 93A that can be located at both sides of the V-axis cam follower 106 in the axial direction of the valve spool 92.

(2) In the example of the above-described embodiment, the Z-axis drive unit 80 and the V-axis drive unit 100 are driven by a linear force, but may be driven by a rotational force.

(3) In the example of the above-described embodiment, the mounting head 50 is a rotary type mounting head having the nozzle shafts 55 arranged in a circular shape. However, the mounting head 50 may be an in-line type mounting head having the nozzle shafts 55 arranged in a straight line.

(4) In the example of the above-described embodiment, the mounting head 50 includes the two V-axis drive units 100 with the shaft of the rotary body therebetween. However, the number of the V-axis drive units 100 in the mounting head 50 is not limited to this.

(5) In the example of the above-described embodiment, the surface mounter 1 including the mounting head 50 is described. However, the mounting head 50 described in the embodiment may be employed in an apparatus other than the surface mounter.

The embodiment of the present disclosure is described above in detail, but the description is merely an example and does not limit the scope of claims. The technology in the scope of the claims includes modifications and changes, which may be added to the above-described specific examples.

The invention claimed is:

1. A surface mounter comprising:
    a stage having a rectangular shape and including a side portion including a side edge of the stage and a mounting portion at which a component is to be mounted on a substrate;
    a substrate transferring device disposed on the stage to transfer the substrate to the mounting portion;
    a component feeding device disposed on the side portion of the stage to feed the component toward the mounting portion; and
    a component mounting device including a mounting head and configured to mount the component on the substrate, the mounting head including:
        a pickup nozzle configured to pick up the component from the component feeding device and hold the component by suction at a front end thereof by a negative pressure and configured to release the component held at the front end by a positive pressure on the substrate;
        a shaft member having a cylindrical shape and configured to move in an axial direction thereof to switch a pressure applied to the pickup nozzle between the negative pressure and the positive pressure, the shaft member having two opposing portions extending in a direction intersecting the axial direction and facing each other with a space therebetween in the axial direction; and
        a drive unit including a drive source, a movable portion configured to move in the axial direction by using power from the drive source, and a cam follower on the movable portion, the cam follower being positioned between the two opposing portions, the drive unit being configured to move the movable portion in the axial direction to perform a first movement operation in which the cam follower is brought into contact with one of the opposing portions to move the shaft member to one side in the axial direction and a second movement operation in which the cam follower is brought into contact with the other of the opposing portions to move the shaft member to the other side in the axial direction.

2. The surface mounter according to claim 1, further comprising a housing, member configured to house at least a portion of the shaft member except the two opposing portions in a movable manner in the axial direction, wherein the shaft member includes a connection portion connecting the two opposing portions and position away from a central axis of the shaft member, and the cam follower on the movable portion that is positioned between the two opposing portions is located on the central axis of the shaft member.

3. The surface mounter according to claim 2, wherein ends of the opposing portions of the shaft member are located inwardly from an outline of the housing member toward a center of the housing member in a planar direction perpendicular to the axial direction.

4. A surface mounter comprising:
- a stage having a rectangular shape and including a side portion including a side edge of the stage and a mounting portion at which a component is to be mounted on a substrate;
- a substrate transferring device disposed on the stage to transfer the substrate to the mounting portion;
- a mounting head configured to mount the component on the substrate, the mounting head including:
  - a shaft retainer including a through hole and a recess each extending in a thickness direction of the shaft retainer;
  - a nozzle shaft passed through the through hole of the shaft retainer to be movable in the thickness direction of the shaft retainer;
  - a pickup nozzle coupled to an end of the nozzle shaft and configured to receive a negative pressure to pick up the component and a positive pressure to release the component;
  - a switching device configured to switch application of pressure to the pickup nozzle between the negative pressure and the positive pressure, the switching device including:
    - a valve shaft disposed in the recess of the shaft retainer to be movable in an axial direction of the valve shaft; and
    - a contact portion coupled to the valve shaft and disposed outside the recess, the contact portion including a first opposing section, a second opposing section, and a connecting section, the first opposing section and the second opposing section extending in a direction perpendicular to the axial direction of the valve shaft and being separated from each other in the axial direction of the valve shaft to be opposed to each other, the first opposing section being coupled to the valve shaft, the connecting section extending in the axial direction of the valve shaft and connecting the first opposing section to the second opposing section;
- a drive unit including:
  - a movable portion configured to move in the axial direction of the valve shaft; and
  - a cam follower coupled to the movable portion and disposed between the first opposing section and the second opposing section of the switching device;
- a component feeding device disposed on the side portion of the stage to feed the component to the mounting head; and
- a controller configured to:
  - drive the substrate transferring device to transfer the substrate to a position at which the component is to be mounted on the substrate;
  - move down the nozzle shaft to set the pickup nozzle at a position at which the component is to be supplied;
  - move the movable portion of the drive unit upward so that the cam follower contacts the second opposing section of the switching device to move up the valve shaft to apply the negative pressure to the pickup nozzle;
  - move the nozzle shaft to position the pickup nozzle adjacent to the substrate; and
  - move the movable portion of the drive unit so that the cam follower contacts the first opposing section of the switching device to move down the valve shaft to apply the positive pressure to the pickup nozzle.

5. The surface mounter according to claim 4, wherein the switching device is mounted to the shaft retainer, the switching device further includes a housing that houses at least a section of the valve shaft, the valve shaft is movable in the axial direction of the valve shaft in the housing, the connecting section of the contact portion is off a central axis of the valve shaft, and the cam follower is aligned with the central axis of the valve shaft.

6. The surface mounter according to claim 4, wherein the first opposing section and the second opposing section horizontally extend from the connecting section, the first opposing section and the second opposing section include distal ends located farther from the connecting section than the central axis, and the distal ends of the first opposing section and the second opposing section are located between the central axis and an outline of the housing on an opposite side from the connecting section.

* * * * *